United States Patent [19]

Itoh et al.

[11] 4,034,311
[45] July 5, 1977

[54] SEMICONDUCTOR LASER

[75] Inventors: Kunio Itoh; Morio Inoue, both of Takatsuki, Japan

[73] Assignee: Matsushita Electronics Corporation, Kadoma, Japan

[22] Filed: Mar. 30, 1976

[21] Appl. No.: 671,948

Related U.S. Application Data

[63] Continuation of Ser. No. 445,895, Feb. 26, 1974, abandoned.

[30] Foreign Application Priority Data

Feb. 26, 1973 Japan .............. 48-22867
Feb. 26, 1973 Japan .............. 48-22868

[52] U.S. Cl. .............. 331/94.5 H; 357/18
[51] Int. Cl.² .............. H01S 3/00
[58] Field of Search .............. 331/94.5 H; 357/16, 357/18

[56] References Cited

UNITED STATES PATENTS

| | | |
|---|---|---|
| 3,309,553 | 3/1967 | Kroemer .............. 331/94.5 H |
| 3,758,875 | 9/1973 | Hayashi .............. 331/94.5 H |
| 3,814,993 | 6/1974 | Kennedy .............. 357/61 |
| 3,821,777 | 6/1974 | James .............. 357/30 |
| 3,982,261 | 12/1976 | Antypas .............. 357/16 |

OTHER PUBLICATIONS

Milnes, et al., "Heterojunctions and Metal Semiconductor Junctions", Academic Pross., New York, pp. 7-9 & 142-148, 1972.

Primary Examiner—Edward S. Bauer
Attorney, Agent, or Firm—Cushman, Darby & Cushman

[57] ABSTRACT

Double-hetero-structure injection laser can be improved to have low threshold current in room-temperature continuous-wave operation. The improvement is obtained in one case wherein an n-type $Ga_{1-y}Al_yAs$ region ($1 \geq y > 0$) is first formed, a $Ga_{1-z}In_zAs$ is grown thereon as an active region and a p-type $Ga_{1-y'}Al_{y'}As$ region is then formed on the active region and the value of z is so selected as to make the lattice constants of the active region smaller than those of the first and third regions.

4 Claims, 5 Drawing Figures

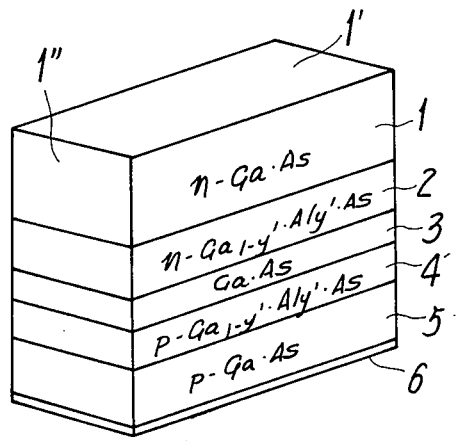
FIG.1.
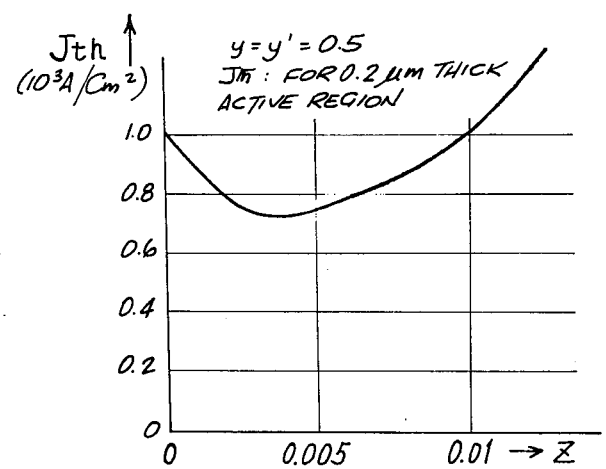
FIG.3.
FIG.4.
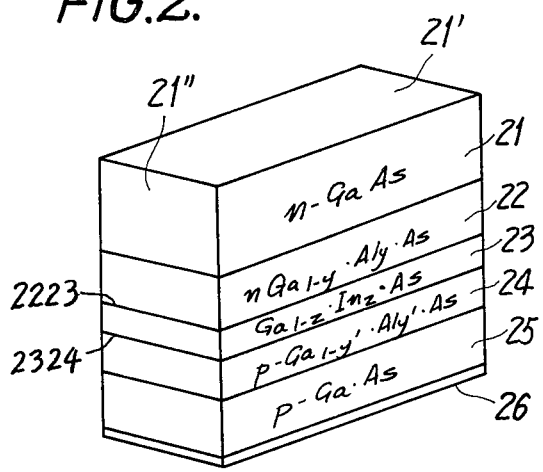
FIG.2.
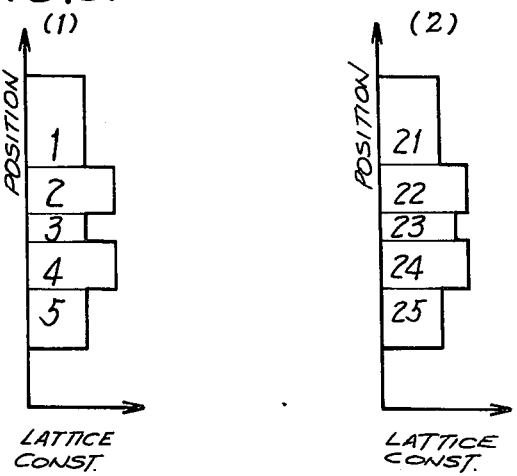
FIG.5.

SEMICONDUCTOR LASER

This is a continuation, of application Ser. No. 445,895 filed Feb. 26, 1974 and now abandoned.

BACKGROUND OF THE INVENTION

This invention relates to an improvement in a double-heterostructure injection laser.

Since a double-heterostructure semiconductor, hereinafter referred to a DHS, laser diode has been developed, threshold currents have been prominently decreased and oscillations on a continuatinous wave basis at room temperature have become possible. One such laser is disclosed in U.S. Pat. No. 3,691,476. In a conventional DHS laser diode, as shown in FIG. 1, a GaAs active region 3 is a sandwiched between an n-type $Ga_{1-y}Al_yAs$ region 2 and a p-type $Ga_{1-y}Al_yAs$ region 4, in order to increase the probability of carrier recombination in the active region 3. Such a laser diode, as shown in FIG. 1, is made by sequential epitaxial growths of the first region 2 of n-type $Ga_{1-y}Al_yAs$, the second region 3 of the GaAs, the third region 4 of p-type $Ga_{1-y'}Al_{y'}As$, and a fourth region 5 of the p-type GaAs, on an n-type GaAs substrate. Reference numeral 1' designates the ohmic contact fact to contact an electrode, and reference numeral 1" designates a cleaved surface.

In order to reduce the threshold current experiments were conducted to select lattice constants having the active region and the neighboring regions about equal to each other. Satisfactory results were not obtained.

SUMMARY OF THE INVENTION

This invention provides a novel double heterostructure semiconductor laser with lower threshold current than conventional lasers of the same type.

The invention is based on a concept of decreasing the dislocations of crystal by including such a specified amount of In in the active region that makes the lattice constant of the active region to be smaller than those of the neighboring regions.

BRIEF DESCRIPTION OF THE DRAWING

The invention will be further understood from the following detailed description and the accompanying drawings wherein:

FIG. 1 is a perspective view of a conventional DHS laser;

FIG. 2 is a perspective view of another embodiment of a DHS laser of the present invention;

FIGS 3 and 4 are graphs showing threshold currents against the value z of the embodiment of FIG. 2, for 0.5 and 0.7 y and y'values of 0.5 and 0.7, respectively; and FIGS. 5(1) and (2) are charts showing the distribution of the lattice constants of the regions of the lasers of FIGS. 1, and 2, respectively.

DETAILED DESCRIPTION OF THE INVENTION

In the following the invention is illustrated, wherein the substrate, wherein the substrate is GaAs, and thereon a first region of $Ga_{1-y}Al_yAs$, a second (i.e., active) region of $Ga_{1-z}In_zAs$, and a third region of $Ga_{1-y'}Al_{y'}As$ are subsequently grown, while controlling lattice constants of the three grown regions in a specified relation.

In FIG. 2, which shows an embodiment of the invention, an n-type GaAs wafer of a specified thickness is used as substrate 21, wherein 21' designates the ohmic contact face to contact an electrode and 21" designates a cleaved surface.

On the principal face of the substrate 21, a first region 22 of n-type $Ga_{0.5}Al_{0.5}As$ is grown to a thickness of 1 to 5 $\mu m$ by liquid-phase epitaxial growth. Then, on the first region, a second region, namely, an active region 23 of $Ga_{1-z}In_zAs$ of 0.2 $\mu m$ thickness is grown, further thereon, a third region 24 of p-type $Ga_{0.5}Al_{0.5}As$ of 1 $\mu m$ thickness is grown, and finally, a fourth region 25 of p-type GaAs of 2 $\mu m$ thickness is grown. Reference numeral 21' designates the ohmic contact face for contacting an electrode, and 21" designates a cleaved surface. Reference numeral 26 designates an ohmic contact layer for contacting another electrode.

In the above-mentioned laser, the lattice constant of the GaAs is 5.6535 A and that of the $Ga_{0.5}Al_{0.5}As$ is 5.6575 A, also the theoretically calculated value of z for making the lattice constant of $Ga_{1-z}In_zAs$ coincide with that of the $Ga_{0.5}Al_{0.5}As$ is $z=0.01$. However, our empirical study revealed that, the optimum value of z was approximately 0.004, as hereinaftermentioned.

FIG. 3 shows the relation between the threshold current density $J_{th}$ graduated on the ordinate axis and the value z graduated on abscissa axis under the condition $y=y'0.5$ in the embodiment of FIG. 2. As can be understood from FIG. 3, when $z=0.01$, the threshold current is almost equal to that when $z=0$, and the minimum threshold current is obtainable at $z=0.004$; whereas, the above-mentioned theoretical value of z for coinciding with the lattice constants is $z=0.01$.

Accordingly, a DHS semiconductor laser diode having the active region 23 of $Ga_{0.996}In_{0.004}As$ sandwiched between the second region 22 and the third region 24 of n-type and p-type $Ga_{0.5}Al_{0.5}As$, respectively, has the lowest threshold current.

In FIG. 4, which shows the relation similar to that shown in FIG. 3, but of another embodiment where $y=y'=0.7$ in the structure of FIG. 2. In this case, the lattice constant of the $Ga_{0.3}Al_{0.7}As$ of regions 22 and 24 is 5.6590 A According to the theoretical calculation, the value z for making the lattice constant of the $Ga_{1-z}In_zAs$ coincide with that of the $Ga_{0.3}Al_{0.7}As$ is $z=0.013$. However, the curve in FIG. 4 shows that the minimum threshold current is obtainable at $z=0.006$, which is smaller than the theoretical value of $z=0.013$.

As above-mentioned, the lowest threshold current is given at such value of z that the lattice constant of the active region is smaller than that of the neighboring $Ga_{1-y}Al_yAs$ regions. The above fact is hypothetically explained as follows: As the lattice constants of the first, second and third regions 22, 23 and 24 are made closer to each other, densities of the traps at the heteroboundaries 2223 and 2324 become similar, but the active region becomes a mixed crystal, and accordingly, the lattice perfection in the active region 23 becomes poor. As a result of this lattice imperfection, the traps increase instead at the coincidence of the lattice constants. Thus, the optimum value of z for attaining the lowest threshold current is lower than the value for making the lattice constants coincide with each other.

For the z value over the 0.015, the threshold current becomes too high, and therefore, in general, the value z of $0.015 > z > 0$ is appropriate to lower the threshold current.

The above-mentioned laser shown in FIG. 2, namely, the DHS semiconductor laser diode with $Ga_{1-z}In_zAs$ active region sandwiched between p-type $Ga_{1-y}Al_yAs$ ($1 \geq y > 0$) and n-type $Ga_{1-y'}Al_{y'}As$ ($1 \geq y' > 0$), wherein the lattice constant of the active region is selected to be smaller than neighboring regions, is capable of having such low threshold current density as 3.7 KA/cm² for $y=y'=0.5$, and 4.0 KA/cm² for $y=y'=0.7$. The above-mentioned two threshold current densities are normalized values, from the 0.2μm thickness of actual active region 23 of the embodiment to 1μm thickness of standard active region; whereas the ordinates of FIGS. 3 and 4 are graduated with actual thicknesses.

In the foregoing, it will be appreciated that the following definitions have been used throughout the specification:

The term "Heterostructure" refers to a structure made by sequential epitaxial growths from sources of different compositions. This structure has several regions of crystal structure, each region having compositions different from neighboring regions;

"Double heterostructure" refers to a structure having an active region sandwiched by a pair of different regions; and "Heteroboundary" is a boundary between two different regions grown by sequential epitaxial growths.

While the novel embodiments of the invention have been described, it will be understood that various omissions, modifications and changes in these embodiments may be made by one skilled in the art without departing from the spirit and scope of the invention.

What is claimed is:

1. A double heterostructure laser comprising:
an n-type GaAs substrate,
a first region of n-type $Ga_{1-y}Al_yAs$ ($1 \geq y > 0$) epitaxially grown on one principal face of said substrate,
a second and active region of $Ga_{1-z}In_zAs$ epitaxially grown on said first region, the value of z being greater than zero and is selected to minimize the current threshold of the laser, by being less than the theoretical value that makes the lattice constant of said active region coincide with those of the neighboring regions,
a third region of p-type $Ga_{1-y'}Al_{y'}As$ ($1 \geq y' > 0$) epitaxially grown on said second region,
and
a fourth region of p-type GaAs epitaxially grown on said third region.

2. A double heterostructure laser of claim 1, wherein $0.004 < z > 0.006$.

3. A double heterostructure semiconductor laser exhibiting a reduced threshold current and having an active region of $Ga_{1-z}In_zAs$ sandwiched between a pair of neighboring region of different conductivity types of $Ga_{1-y}Al_yAs$ ($1 \geq y > 0$) wherein:
z is selected to minimize the current threshold by being greater than zero and less than the theoretical value that makes the lattice constant of the active region coincide with the lattice constant of the adjacent neighboring regions.

4. A double heterostructure laser of claim 3, wherein $0.004 < z < 0.006$.

* * * * *